United States Patent
Singh et al.

(10) Patent No.: US 6,489,879 B1
(45) Date of Patent: Dec. 3, 2002

(54) PTC FUSE INCLUDING EXTERNAL HEAT SOURCE

(75) Inventors: Inderjit Singh, San Jose, CA (US); Hem Takiar, Fremont, CA (US); Geoffrey Cade Murray, Fremont, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/549,240

(22) Filed: Dec. 10, 1999

(51) Int. Cl.[7] ............... H01H 85/044; H01H 85/143
(52) U.S. Cl. ............... 337/167; 337/153; 337/182; 337/183
(58) Field of Search ............... 337/167, 152, 337/153, 160, 182, 183, 184, 185, 221, 290, 297, 426; 429/7, 58, 62, 57, 59

(56) References Cited

U.S. PATENT DOCUMENTS

| | | | | |
|---|---|---|---|---|
| 4,546,305 A | * | 10/1985 | Goddijn et al. | 323/299 |
| 4,780,598 A | * | 10/1988 | Fahey et al. | 219/511 |
| 4,864,624 A | * | 9/1989 | Tichy | 381/55 |
| 4,891,563 A | * | 1/1990 | Ganser et al. | 315/309 |
| 5,712,610 A | * | 1/1998 | Takeichi et al. | 337/290 |
| 5,831,508 A | * | 11/1998 | Ikeda | 337/35 |
| 5,864,458 A | * | 1/1999 | Duffy et al. | 361/93 |
| 5,998,051 A | * | 12/1999 | Poirier et al. | 429/7 |

FOREIGN PATENT DOCUMENTS

JP            2001-6518 A   *   1/2001       H01H/85/00

OTHER PUBLICATIONS

The Illustrated Dictionary of Electronics, Sixth Edition, Stan Gibilisco, p. 176.*
Bourns, Inc., "Bourns Multifuse® Polymer PTC Resettable Fuses Help Protect Pressure Sensors From Short–Circuit–Induced Overheating", www.bourns.com/html/mfsensor.htm, downloaded from the internet on Jun. 21, 1999 (website last updated on Apr. 6, 1999 as of download), 2 pages.
Bourns, Inc., "Polymer PTC Resettable Fuses Play An Important Role in Protecting Automotive Sound Systems", www.bourns.com/html/apnmfspkr.htm, downloaded from the internet on Jun. 21, 1999 (website last updated on Apr. 6, 1999 as of download), 4 pages.

* cited by examiner

Primary Examiner—Anatoly Vortman
(74) Attorney, Agent, or Firm—Beyer Weaver & Thomas LLP

(57) ABSTRACT

An improved PTC fuse assembly is described. The PTC fuse assembly includes a PTC fuse having a PTC material. To expedite heating of the PTC material, the improved PTC fuse assembly includes a die package in thermal communication with the PTC material. The die package includes a die which is responsible generating heat once a threshold has been reached. To mount the die package to a printed circuit board, the die package includes leads. The leads are sufficiently flexible such that the heat generated by the die does not compromise performance of the PTC protection circuit.

11 Claims, 4 Drawing Sheets

PTC FUSE INCLUDING EXTERNAL HEAT SOURCE

FIELD OF THE INVENTION

The present invention relates generally to fuse assemblies for protecting against electrical surges and/or overcharging. More particularly, an improved externally heated positive temperature coefficient (PTC) fuse assembly is described.

BACKGROUND OF THE INVENTION

In a number of electrical components, it is desirable to provide fuses to protect against electrical surges. There are currently a number of commercially available fuse styles. One available type of fuse is known as a positive temperature coefficient fuse. A representative positive temperature coefficient (PTC) fuse is illustrated in FIG. 1A. The representative PTC fuse 50 has a top plate (top contact pad) 52 and a bottom plate (bottom contact pad) 54 that are separated by a positive temperature coefficient resistor (PTC) material 56. The PTC fuse 50 operates such that, at a threshold temperature, the electrical resistance of the PTC material 56 increases dramatically.

As seen in the battery protection diagram 60 of FIG. 1B, the PTC fuse 50 may be used to protect a battery 75 during charging with a voltage source 77. By way of example, the battery 75 may be included in a cellular telephone and the PTC fuse 50 may be implemented to protect the battery 75 from excessive current as a result of an individual using an improper voltage source, e.g. an improper power pack.

The contact pads 52 and 54 each have tabs 57, 59 which are bent down to form sidewalls that define a cavity 61 beneath the bottom contact pad 54. Solder posts 67 are formed on the tips of bent down tabs 57, 59. With this arrangement, the fuse can be mounted on a printed circuit board 69 (or other appropriate substrate) by soldering the solder posts 67 to appropriate landings 71 on the printed circuit board 69.

In operation, the PTC material 56 often does not heat up fast enough to protect the battery 75. As illustrated in FIG. 1C, in order to expedite heating of the PTC material 56, a die 64 may be attached to the bottom surface 55 of the bottom contact pad 54 to externally heat the PTC material 56. The die 64 may include a flip chip packaged zener diode, for example, which generates heat once a particular voltage has been reached. The die 64 also includes solder bumps 66 to mount the die 64 on the board 69 by soldering the solder bumps 66 to appropriate landings 79.

For the battery protection diagram 80 of FIG. 1D, the threshold voltage for the packaged zener diode of the die 64 is then set relative to the voltage of the battery 75. When the threshold voltage of the packaged zener diode is exceeded, it begins to draw current and externally heat the PTC material 56. The die 64 material (i.e., silicon) typically heats up more rapidly than the PTC fuse 50, and with the contact area between the die 64 and the bottom contact pad 54, the PTC material 56 reaches its threshold temperature faster. In addition, when the threshold voltage of the packaged zener diode is exceeded, the diode conducts at lesser resistance than the battery 75 and PTC fuse 50. As a result, the current is shunted away from the battery 75, further protecting the battery 77 and increasing the heat generation in the die 64.

In some cases, upon heating of the die 64, the solder bumps 66 may begin to melt. In other cases, upon heating of the die 64, the die 64 thermally expands and the solder bumps 66 crack. In either case, contact is lost, the die 64 is no longer functional and the protection circuit is unreliable.

In view of the foregoing, it should be apparent that an improved PTC device would be desirable.

SUMMARY OF THE INVENTION

To achieve the forgoing and other objects and in accordance with the purpose of the invention, an improved fuse assembly for protecting against electrical surges is described. The fuse assembly includes a PTC fuse, a die that serves as an external heat source for the PTC fuse and a lead frame based structure that facilitates electrical connection of the fuse assembly to a suitable substrate. The PTC fuse includes a PTC material which is normally conductive, but upon reaching a predetermined temperature, becomes non-conductive or substantially less conductive. To expedite heating of the PTC material, the fuse assembly includes a die package in thermal communication with the PTC material. The die package includes a die which generates heat once a threshold has been reached. To mount the die package to a substrate, the die package includes leads. The leads may be bent and surface mounted to the substrate using conventional techniques. The leads are sufficiently flexible such that the heat generated by the die does not compromise performance of the PTC protection circuit, i.e. by thermal expansion of the die package or parts thereof.

In a described embodiment, the improved PTC fuse assembly is used to protect a battery. In this embodiment, the die is placed in electrical parallel to the terminals of the battery and PTC fuse such that when a predetermined threshold voltage is reached, the current shunts through the die. In one embodiment, the die consists of one or more zener diodes which heat up after the predetermined threshold voltage has been reached. Correspondingly, the PTC material is externally heated, thereby activating the PTC fuse, which further prevents undesired current flow to the battery.

BRIEF DESCRIPTION OF THE DRALEADS

The present invention is illustrated by way of example, and not by way of limitation, in the figures of the accompanying drawings and in which like reference numerals refer to similar elements and in which.

DETAILED DESCRIPTION

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well known processes, procedures, components, and circuits have not been described in detail so as not to unnecessarily obscure aspects of the present invention.

Figure 2:
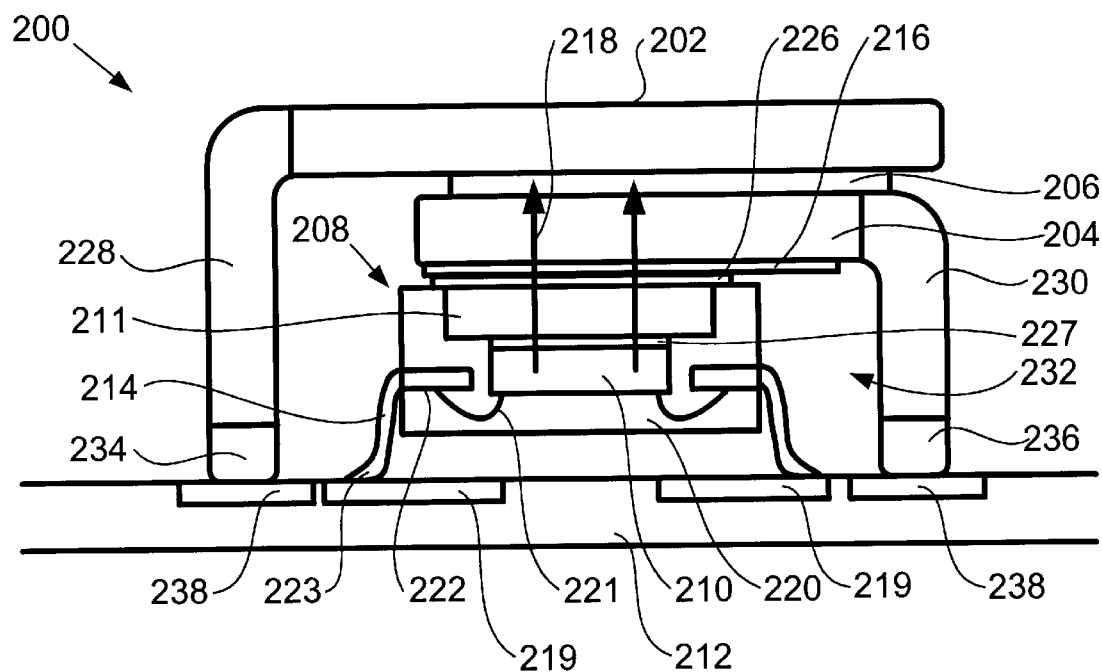
FIG. 2 is a diagrammatic cross section of a PTC fuse assembly in accordance with one embodiment of the present invention.

Referring initially to FIG. 2, a diagrammatic cross section of a PTC fuse assembly 200 is shown in accordance with one embodiment of the present invention. The PTC fuse assembly 200 has a top plate (top contact pad) 202 and a bottom plate (bottom contact pad) 204 that are separated by a positive temperature coefficient resistor (PTC) material 206. The PTC material 206 is electrically conductive until a threshold temperature is reached. In principle, once the threshold is reached, the conductivity of the resistor material drops significantly (and ideally, they would become nonconductive). The PTC fuse assembly 200 also includes a die package 208 to externally heat the PTC material 206. To expedite heating of the PTC material 206, the die package 208 includes a die 210. The die 210 is responsible for generating heat once a threshold has been reached. The die package 208 is orientated such that a die attach pad 211 is in thermal contact with the bottom contact pad 204. The die attach pad is in thermal communication with the die 210. To mount the die package 208 to a substrate 212, such as a printed circuit board for example, the die package 208 includes leads 214. For the die package 208, the leads 214 may be formed by bending the leads of a conventional lead frame. The leads 214 are sufficiently flexible such that thermal expansion of the die package 208, or parts thereof, does not compromise performance of the protection circuit 200.

The PTC fuse assembly 200 provides rapid heating of a substantial portion of the PTC material 206. Preferably, the PTC fuse assembly 200 includes a large contact surface area between the die attach pad 211 and the bottom contact pad 204. In one embodiment, to improve heat conduction between the die 210 and the PTC material 206, a heat spreader 216 is interposed between the die attach pad 211 and the bottom contact pad 204. The heat spreader 216 delocalizes heat transfer and increases the thermal contact area between the die attach pad 211 and the bottom contact pad 204. Advantageously, the heat spreader 216 spreads the heat generated by the die 210 despite the relative size and/or shape differences between the two. In addition, the heat spreader 216 corrects for any local heating effects in the die 210. Alternatively, if the die attach pad 211 and the bottom contact pad 204 are of similar size and/or shape, the die package 208 maybe affixed without the heat spreader 216.

The connection between the die attach pad 211 and the heat spreader 216 is both electrically and thermally conductive, as is the connection between the PTC material 206 and the heat spreader 216. Preferably, the heat spreader 216 has a high thermal conductance in a direction of heat transfer 218 to expedite heating of the PTC material 206. In addition, the heat spreader 216 preferably has a high thermal conductance in the plane perpendicular to the direction of heat transfer 218 to spread the heat generated by the die 210 to as large PTC material as possible.

The leads 214 may be of any geometry and material to allow the desired flexibility under thermal expansion while maintaining electrical contact between the substrate 212 and the die package 208. In a preferred embodiment, the leads are included as leads of a lead frame used to construct the die package 208. In this case, the leads 214 may be made from copper. To connect the leads 214 to the die 210, bond wires 221 are used at an inner portion 222. To connect the leads 214 to the substrate 212, solder maybe used at landings 219.

Dimensions suitable for the leads 214 range from about 50 to 80 mil wide strips having a thickness from about 6 to 10 mils.

The protection circuit 200 includes an encapsulation material 220. The encapsulation material 220 acts to physically protect the components of the die package 208. The encapsulation material 220 also provides mechanical support for the die package 208. In a preferred embodiment, the encapsulation material 220 has high thermal resistance and aids in directing the heat generated by the die 210 in the direction of heat transfer 218.

To attach the die package 208 to the heat spreader 216, an attach layer 226 is disposed between the die attach pad 211 and the heat spreader 216. At a minimum, the attach layer 226 is thermally conductive. Preferably, the attach layer 226 has a high thermal conductance. In one embodiment, the attach layer 226 is an epoxy or other high conductance die attach material. By way of example, an epoxy such as Thermax by Ablestick of Fremont, Calif. is suitable. In another embodiment, the attach layer 226 is a eutectic solder. In this case, the solder permits electrical communication between the die attach pad 211 and the heat spreader 216. In addition, the attach layer 226 preferably has a melting point well above the temperature range reached during heating of the PTC material 206. By way of example, a solder used in the attach layer having a melting temperature about 200 degrees Celsius is suitable. Further, the attach layer 226 preferably has a coefficient of thermal expansion similar to the materials to which it adheres.

A die attach adhesive 227 is used to attach the die 210 to the die attach pad 211. The die attach adhesive 227 may be any suitable material, such as an epoxy or other high conductance die attach material, known in the art. If electrical communication is desired between the die 210 and the PTC material 206, than the die attach layer 227 is suitably electrically conductive.

The top and bottom contact pads 202 and 204 each have tabs 228 and 230 respectively which are bent down to form terminations that define a cavity 232 beneath the bottom contact pad 204. To facilitate thermal spreading to the PTC material 206, the contact pads 202 and 204 may be plated with brass or another thermally conductive material. Solder posts 234 and 236 are formed on the tips of bent down tabs 228 and 230. With this arrangement, the fuse can be mounted on the substrate 212 by soldering the solder posts 234 and 236 to appropriate landings 238 on the substrate 212.

Figure 1A:
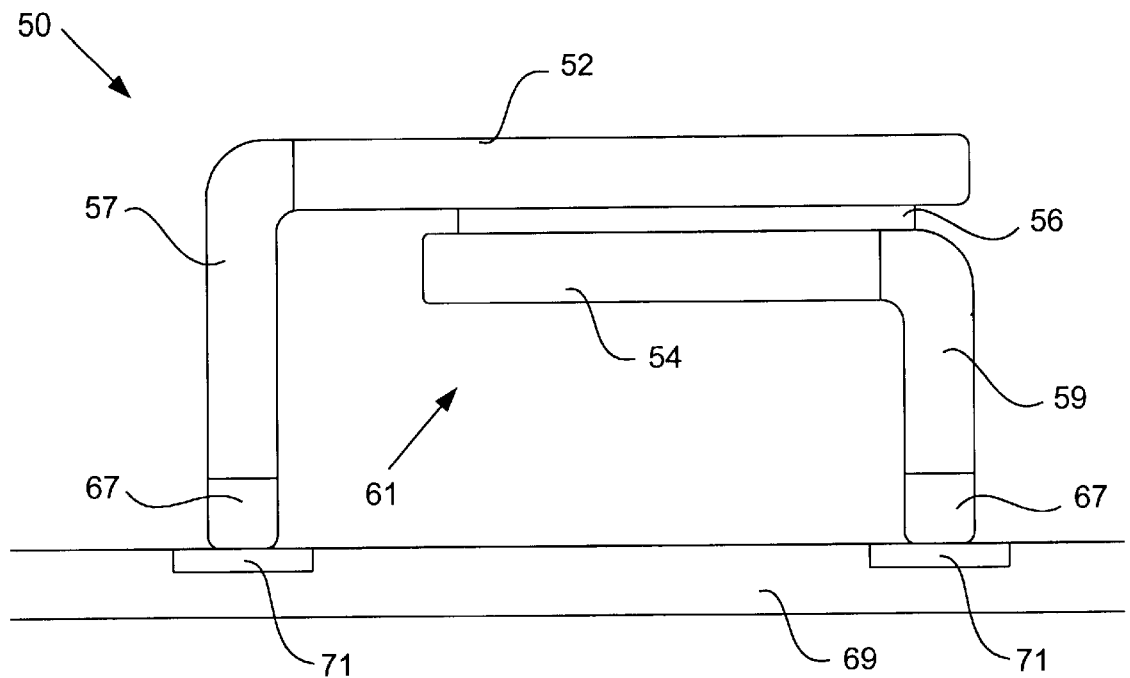
FIG. 1A is a representative drawing of a conventional PTC fuse.
Figure 1B:
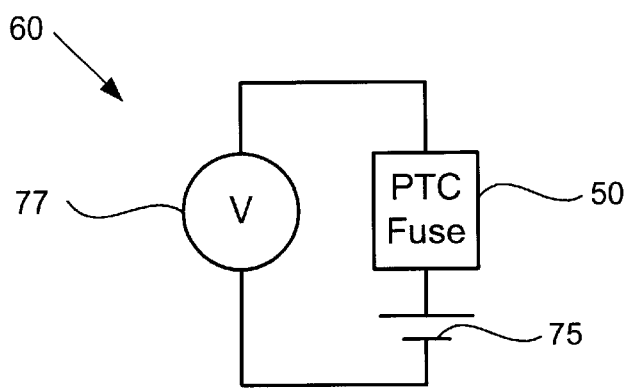
FIG. 1B is a battery protection diagram using the apparatus of FIG. 1A.
Figure 1C:
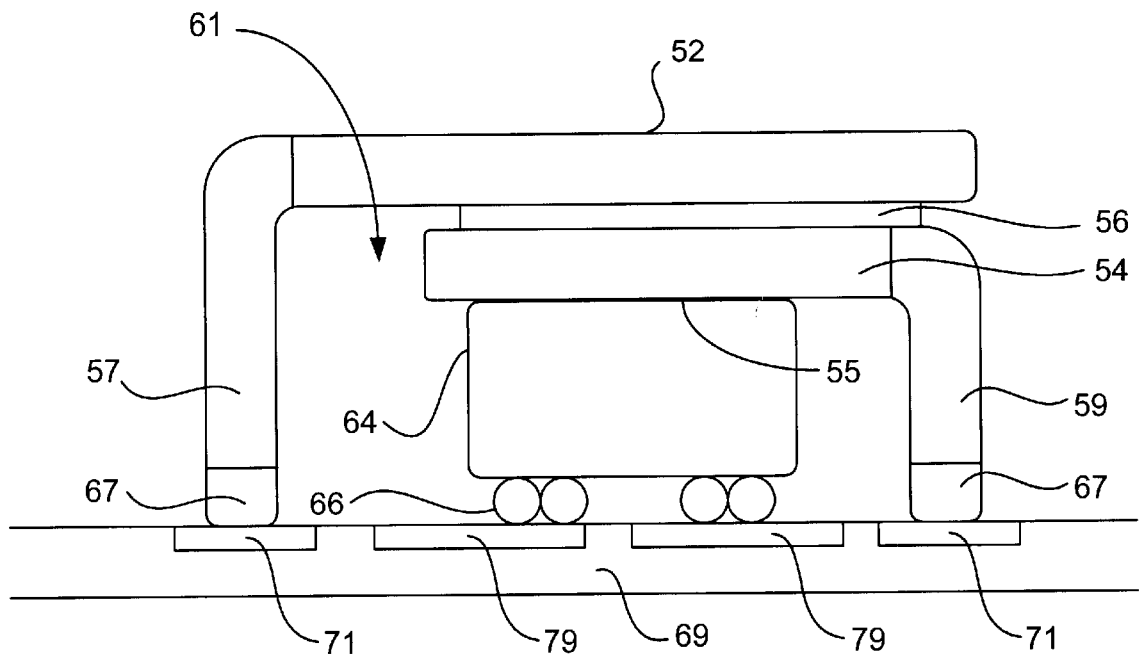
FIG. 1C is a representative drawing of a conventional PTC fuse including a die including solder bumps for externally heating the PTC fuse.
Figure 1D:
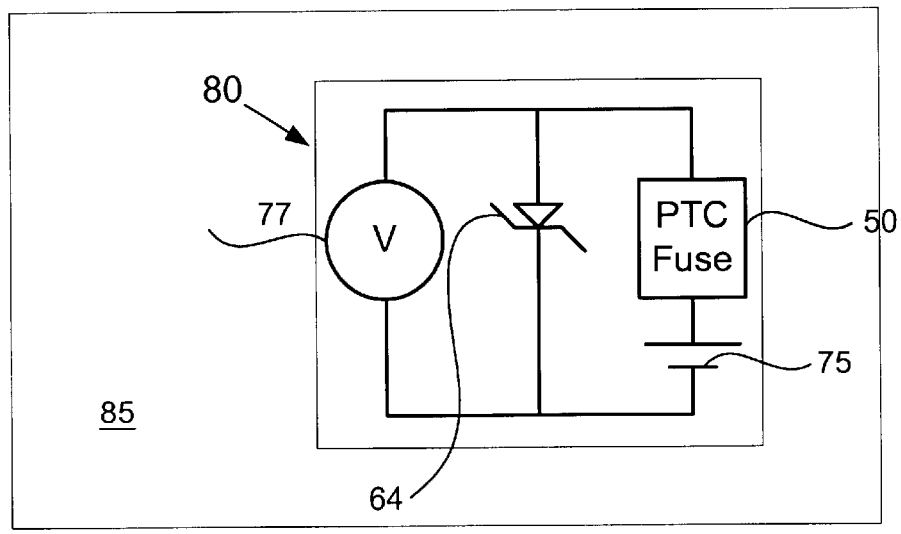
FIG. 1D is a battery protection diagram using the apparatus of FIG. 1B.

Typically, the PTC material 206 has a PTC threshold suitable for a particular application. By way of example, for the battery protection circuit of FIG. 1D, the PTC material 206 may have a temperature threshold in the range of approximately 90 to 100 degrees Celsius. In addition to varying the PTC material 206, the geometry, size and thickness of the PTC material 206 may altered to vary the PTC threshold. Generally speaking, the PTC material 206 may be any material suitable for forming a PTC fuse. In one embodiment, the PTC material 206 is a resistor paste applied between the top contact pad 202 and the bottom contact pad 204. Preferably, the PTC material 206 does not degrade under the conditions of a single heating and is reusable upon subsequent return to conditions below the temperature threshold. In one embodiment, the PTC material 206 is a Polymer Positive Temperature Coefficient device as provided by Bourns Corp. of Orange County, Calif.

Similarly, the die 210 has a threshold for heating the PTC material 206 determined by a particular application. For the battery charging circuit of FIG. 1D, the threshold is a predetermined voltage. Alternatively, the threshold may be a predetermined current or temperature.

In one embodiment, the threshold voltage is realized by a zener diode array included in the die 210. Once a predetermined threshold voltage is reached, the zener diode array draws current and heats the PTC material 206. It should be noted that, upon reaching the predetermined threshold voltage, the zener diode array conducts openly, shunting the current away from the battery which further protects the battery (and further increases heat generation). The predetermined threshold voltage may be chosen relative to the charging voltage of the battery 77. As the battery 77 voltage may be included in an industry standard, the predetermined threshold voltage of the zener diode array may then be designed relative to the industry standard. Preferably, the predetermined threshold voltage is set slightly higher than the charging voltage of the battery 75. By way of example, an appropriate zener diode threshold voltage for use with a battery having a charging voltage of 4.0 volts may be about 4.3 to 4.4 volts with a tolerance of 0.1 volts. When the die 210 includes one or more zener diodes, any semiconducting material may be used, such as gallium arsenide, indium phosphate or silicon. Additionally, the present invention encompasses any particular zener diode arrangement in the die 210. By way of example, the die 210 may include an array of zener diodes attached in parallel across the leads 222 of the die 210.

Figure 3:
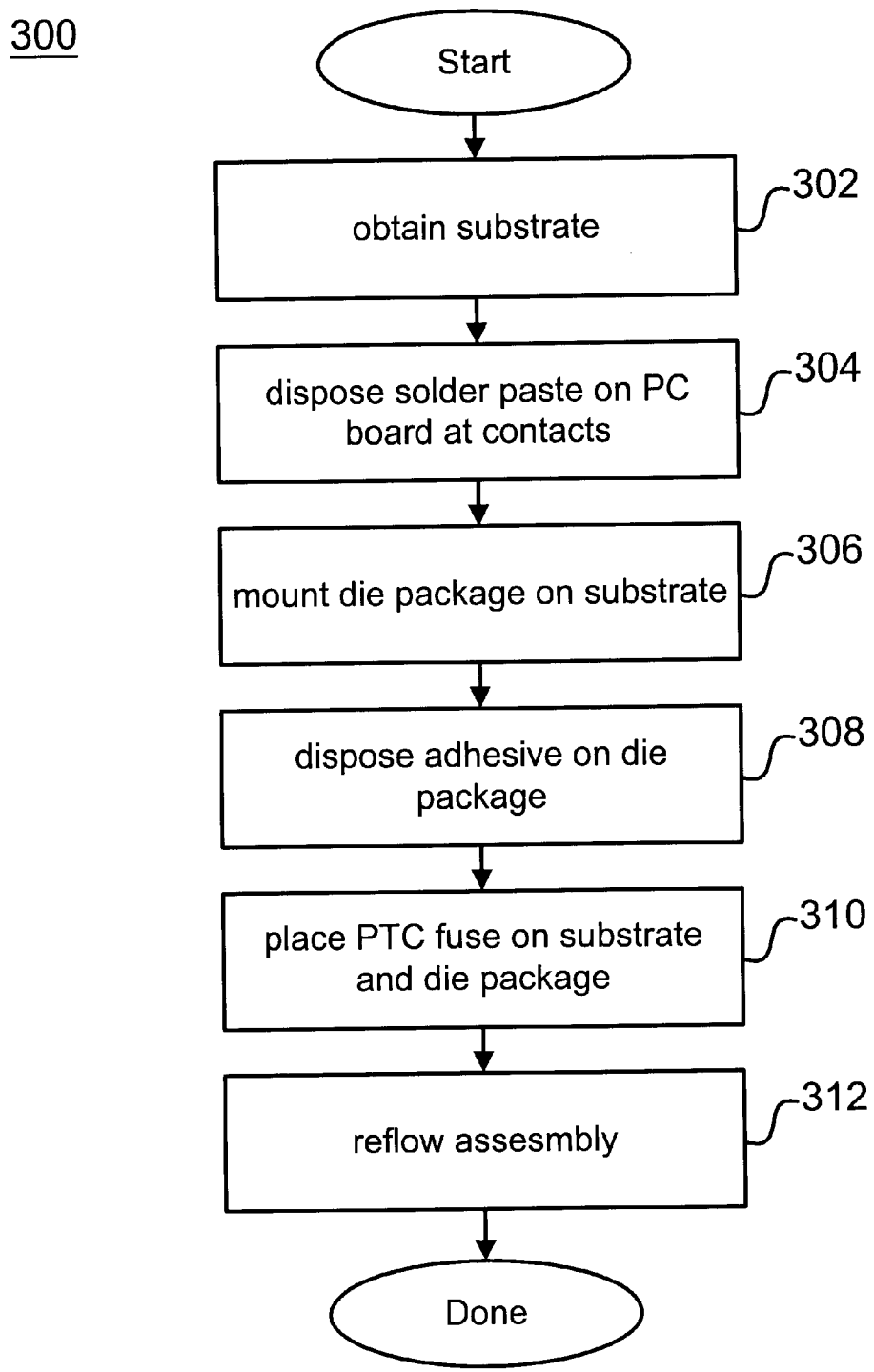
FIG. 3 illustrates a simplified process of constructing a PTC fuse assembly of FIG. 2 in accordance with one embodiment of the present invention.

FIG. 3 illustrates a simplified process 300 of constructing the PTC fuse assembly 200 in accordance with one embodiment of the present invention. The process 300 begins with obtaining a substrate 212, such as a printed circuit (PC) board (302) for example. To facilitate attachment of the leads 214, solder paste may be dispensed onto the landings 219 which receive the leads 214 (304). By way of example, a screen print may be used to lay the solder on the landings 219. Subsequently, the die package 208 is surface mounted on the substrate 212 with the leads 214 meeting the landings 219 (306). The die package 208 may be made by any suitable processes known in the art provided that the die attach pad 211 is left exposed and the leads 214 are extended away therefrom.

An adhesive, such as a high thermal conductance epoxy for example, is then placed on a portion of the die package 208 which will be in contact with the bottom contact pad 204 of the PTC fuse (308). An adhesive may also be added to the appropriate landings 238 which receive the solder posts 234 and 236. In an alternative embodiment, the adhesive may be added to the landings 238 when the solder paste is deposed onto the landings 219 which receive the leads (304). In addition, the die package 208 may be provided with an adhesive (thereby removing 308). Subsequently, the PTC fuse is mounted in close proximity and thermally coupled to the die attach pad 211 and electrically coupled the landings (310). The entire assembly is then reflowed to treat any solder paste and integrate the components (312).

Broadly speaking, the present invention is suitable for any application implementing a PTC fuse. By way of example, the PTC protection circuit 200 is suitable for the battery protection circuit of FIG. 1D. Advantageously, PTC protection circuit 200 may be used multiple times to protect the battery 75 and is not limited to a single protection. In one embodiment, the PTC fuse assembly 200 is implemented to protect a battery in a cellular telephone 85. More specifically, the PTC protection circuit 200 may be used to protect the battery from excessive current during charging.

Although only a few embodiments of the present invention have been described in detail, it should be understood that the present invention may be realized in many other forms without departing from the spirit or scope of the invention. Particularly, although the invention has been described primarily in the context of PTC protection fuse having tabs 228 and 230 bent down to contact the substrate 212, other mechanisms of contact between the PTC fuse and substrate 212 are possible. By way of example, the PTC fuse may be made from a plastic formed into thin sheets and having electrodes attached to either side. In addition, although the die attach pad 211 and the bottom contact pad 204 have been discussed as being are open to air before attaching, as this may be realized with minor modifications to existing technology, the present invention is not limited in this manner. By way of example, the PTC material 206 may be contained within a molded package instead of being partially exposed.

Although various details have been omitted for brevity's sake, obvious design alternatives may be implemented. For example, the die 210 may also include additional functions and may therefor require additional leads. Alternatively, additional contacts from the substrate 212 to the die 210 may be used to increase the current capability of the structure. Further, although many of the materials and manufacturing processes used in the manufacture of the PTC protection circuit 200 may be kept to industry standards to reduce cost, the present invention is not limited to these standards and may include other adaptations to further expedite heat transfer or improve the performance the PTC protection circuit 200. For example, a heat sink may be attached to the PTC fuse to facilitate heat transfer. In this case, alternate means of electrically contacting the heat sink would be required. Therefore, the present examples are to be considered as illustrative and not restrictive, and the invention is not to be limited to the details given herein, but may be modified within the scope of the appended claims.

What is claimed is:

1. A positive temperature coefficient (PTC) fuse assembly comprising:

a PTC fuse having a pair of contacts and a PTC material disposed between the contacts;

a die for externally heating the PTC fuse; and a plurality of leads far electrically and mechanical coupling the die to an external device wherein the leads are electrically connected to the die by bonding.

2. A fuse assembly as recited in claim 1 further comprising an encapsulating material for encapsulating the bonding wires and at least a portion of the die and the leads.

3. A fuse assembly as recited in claim 1 wherein the leads provide sufficient flexibility such that thermal expansion of the die does not compromise the PTC fuse assembly.

4. A fuse assembly as recited in claim 1 further comprising a heat spreader disposed between the die and the PTC fuse to facilitate heat transfer between the die and the PTC fuse.

5. A fuse assembly as recited in claim 1 wherein the PTC fuse assembly is used for protecting a battery from excessive current.

6. A fuse assembly as recited in claim 1 wherein the die generates heat upon reaching a predetermined voltage.

7. A fuse assembly as recited in claim 6 wherein the die includes an array of zener diodes.

8. A fuse assembly as recited in claim 6 wherein the die decreases the current provided to the PTC material when the predetermined voltage is reached.

9. A battery circuit comprising:

a substrate;

a positive temperature coefficient (PTC) fuse in electrical communication with the substrate;

a die attached to and in electrical communication with the substrate and thermal communication with the PTC fuse, wherein the die includes an exposed pad and is attached to the substrate using a plurality of flexible leads, and wherein the PTC fuse includes a first electrically conductive material attached with the exposed pad and attached with the substrate, a PTC material attached with the first electrically conductive material and a second electrically conductive material attached with the PTC material and attached to the substrate; and a battery in electrical communication with the PTC fuse.

10. A battery circuit as recited in claim 9 further including a voltage source in electrical communication with the PTC fuse.

11. The battery circuit of claim 9 wherein the battery circuit is included in a cellular telephone.

* * * * *

UNITED STATES PATENT AND TRADEMARK OFFICE
CERTIFICATE OF CORRECTION

PATENT NO.    : 6,489,879 B1                                         Page 1 of 1
DATED         : December 3, 2002
INVENTOR(S)   : Singh et al.

It is certified that error appears in the above-identified patent and that said Letters Patent is hereby corrected as shown below:

Column 6,
Line 45, change "far" to -- for --
Line 47, after "bonding" add -- wires --

Signed and Sealed this

Thirteenth Day of May, 2003

JAMES E. ROGAN
*Director of the United States Patent and Trademark Office*